(12) United States Patent
Mifune et al.

(10) Patent No.: US 11,486,324 B2
(45) Date of Patent: Nov. 1, 2022

(54) ELECTRONIC CONTROL UNIT

(71) Applicant: Hitachi Astemo, Ltd., Hitachinaka (JP)

(72) Inventors: Yuta Mifune, Hitachinaka (JP); Koichi Tsukio, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 17/284,972

(22) PCT Filed: Sep. 19, 2019

(86) PCT No.: PCT/JP2019/036683
§ 371 (c)(1),
(2) Date: Apr. 13, 2021

(87) PCT Pub. No.: WO2020/080029
PCT Pub. Date: Apr. 23, 2020

(65) Prior Publication Data
US 2021/0359600 A1  Nov. 18, 2021

(30) Foreign Application Priority Data

Oct. 19, 2018 (JP) .............................. JP2018-197134

(51) Int. Cl.
*F02D 41/20* (2006.01)
*F02D 41/04* (2006.01)
(Continued)

(52) U.S. Cl.
CPC ............ *F02D 41/042* (2013.01); *B60R 16/03* (2013.01); *F02D 41/20* (2013.01); *F02M 51/00* (2013.01); *H02H 9/001* (2013.01); *H02M 3/156* (2013.01); *H03K 17/687* (2013.01); *F02D 2041/2003* (2013.01); *F02D 2041/2006* (2013.01);
(Continued)

(58) Field of Classification Search
CPC ..... F02D 2041/2003; F02D 2041/2006; F02D 2041/2024; F02D 2041/2082
See application file for complete search history.

(56) References Cited

U.S. PATENT DOCUMENTS 6,044,823 A * 4/2000 Watanabe ............. F02D 41/365
                                                            123/490
8,478,509 B1 * 7/2013 Kirkpatrick ............. F02D 41/20
                                                            123/480
(Continued)

FOREIGN PATENT DOCUMENTS

JP    64-64534 A    3/1989
JP    5-252672 A    9/1993
(Continued)

OTHER PUBLICATIONS

International Search Report (PCT/ISA/210) issued in PCT Application No. PCT/JP2019/036683 dated Dec. 24, 2019 with English translation (four (4) pages).
(Continued)

*Primary Examiner* — Erick R Solis
(74) *Attorney, Agent, or Firm* — Crowell & Moring LLP

(57) ABSTRACT

A drive circuit is controlled when power is interrupted. When power is turned off, a main power supply is switched to a sub-power supply, and a residual charge of a step-up circuit is lowered to a drive voltage of a drive circuit using a step-down circuit is used as the sub-power supply.

7 Claims, 6 Drawing Sheets

1: INJECTOR VALVE OPENING POWER SUPPLY UNIT
10: POWER GENERATION CIRCUIT
20: POWER SUPPLY SWITCH A
21: POWER SUPPLY SWITCH B
25: SWITCH CIRCUIT
30: PRE-DRIVER CIRCUIT
40: STEP-DOWN CIRCUIT
50: INJECTOR DRIVER CIRCUIT
51: INJECTOR VALVE OPENING DRIVER
52: INJECTOR VALVE-OPENING HOLDING DRIVER
53: INJECTOR LOW-SIDE DRIVER
60: INJECTOR

(51) Int. Cl.
  *B60R 16/03* (2006.01)
  *F02M 51/00* (2006.01)
  *H02H 9/00* (2006.01)
  *H02M 3/156* (2006.01)
  *H03K 17/687* (2006.01)

(52) U.S. Cl.
  CPC .............. *F02D 2041/2024* (2013.01); *F02D 2041/2082* (2013.01)

(56) References Cited

U.S. PATENT DOCUMENTS

2003/0140899 A1* 7/2003 Bolz .................. F02D 41/20
  361/152
2016/0326977 A1 11/2016 Kugumiya et al.

FOREIGN PATENT DOCUMENTS

| | | | |
|---|---|---|---|
| JP | 6-6934 A | 1/1994 | |
| JP | 2001-43145 A | 2/2001 | |
| JP | 2009-100546 A | 5/2009 | |
| JP | 2010-233380 A | 10/2010 | |
| JP | 2016-211425 A | 12/2016 | |
| WO | WO 87-05075 | * 8/1987 | ............. F02D 41/20 |

OTHER PUBLICATIONS

Japanese-language Written Opinion (PCT/ISA/237) issued in PCT Application No. PCT/JP2019/036683 dated Dec. 24, 2019 (seven (7) pages).

Japanese-language Office Action issued in Japanese Application No. 2020-552982 dated Aug. 2, 2022 with English translation (six (6) pages).

* cited by examiner

1: INJECTOR VALVE OPENING POWER SUPPLY UNIT
10: POWER GENERATION CIRCUIT
20: POWER SUPPLY SWITCH A
21: POWER SUPPLY SWITCH B
25: SWITCH CIRCUIT
30: PRE-DRIVER CIRCUIT
40: STEP-DOWN CIRCUIT
50: INJECTOR DRIVER CIRCUIT
51: INJECTOR VALVE OPENING DRIVER
52: INJECTOR VALVE-OPENING HOLDING DRIVER
53: INJECTOR LOW-SIDE DRIVER
60: INJECTOR

70: NPN TRANSISTOR
71 PNP TRANSISTOR
72: PNP TRANSISTOR

80: POWER SUPPLY IC
90: CIRCUIT A
100: CIRCUIT B
110: POWER GENERATION CIRCUIT
120: POWER SUPPLY SWITCH

130: PNP TRANSISTOR

ELECTRONIC CONTROL UNIT

TECHNICAL FIELD

The present invention relates to a technique for improving the safety and reliability of an electronic control unit.

BACKGROUND ART

There is a technique described in PTL 1, for example, as a technique for supplying sub-power to a circuit after power is cut off.

CITATION LIST

Patent Literature

PTL 1: JP 2001-43145 A

SUMMARY OF INVENTION

Technical Problem

A circuit that drives a load is provided with an element including a capacitor such as a step-up circuit. After the power is cut off, an electric charge remaining in the capacitor is applied to another circuit.

Basically, a circuit is designed to withstand the application of such a charge, but it is desirable to reduce the time during which such stress is applied to the circuit since the life of the circuit is improved. PTL 1 leaves room for studies regarding the above viewpoint.

An object of the present invention is to provide an electronic control unit improved in durability by consuming a charge remaining in a step-up circuit or the like in another circuit such as a drive circuit when power supplied to the electronic control unit is cut off.

Solution to Problem

In order to achieve the above object, an electronic control unit according to the present invention includes: a second circuit used as a power supply of a first circuit; and a first switch connecting the second circuit to a third circuit, and is configured to turn on the first switch after cutting off power supply to the second circuit such that a charge remaining in the second circuit is consumed by the third circuit.

Advantageous Effects of Invention

According to the present invention, the charge remaining in the circuit can be consumed in the third circuit after cutting off the power supplied to the electronic control unit.

DESCRIPTION OF EMBODIMENTS

Hereinafter, embodiments of the present invention will be described with reference to the drawings.

First Embodiment

A first embodiment of the present invention will be described with reference to FIGS. 1 to 4.

Figure 1:
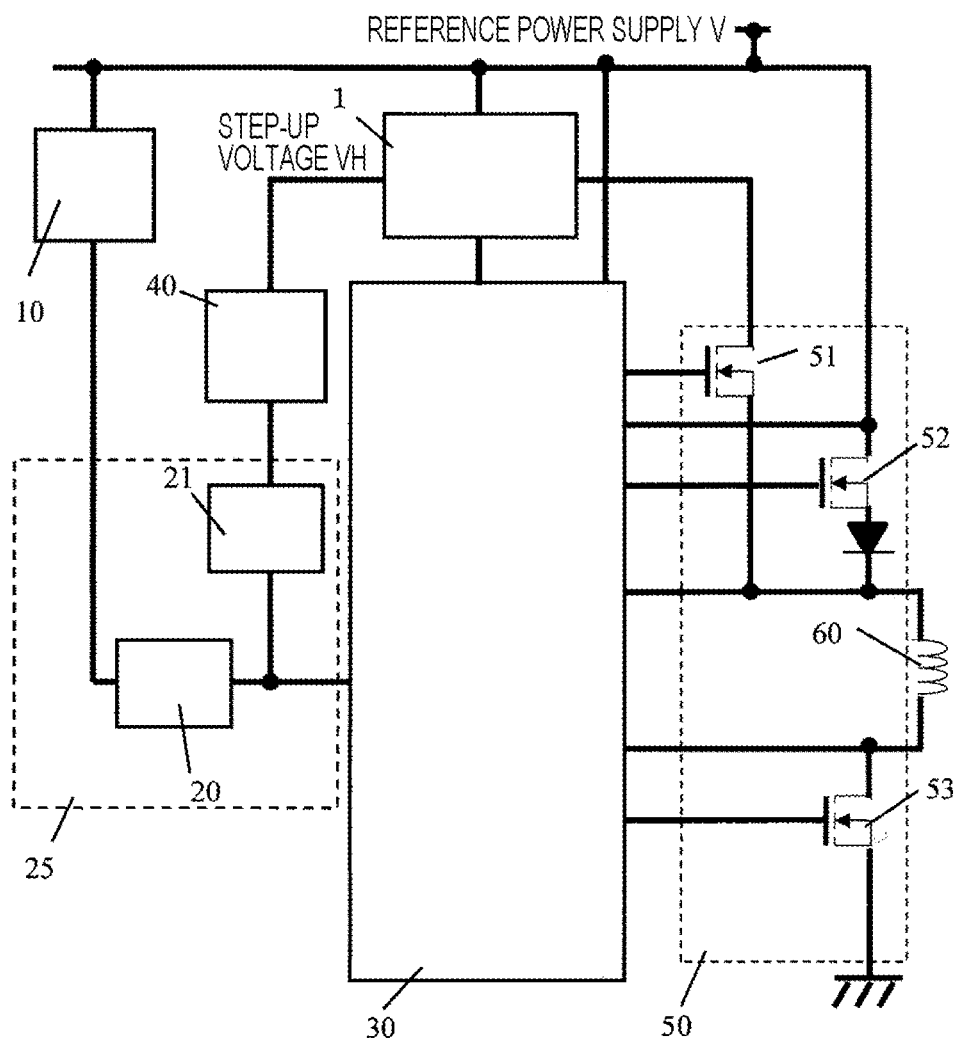
FIG. 1 is a circuit configuration according to a first embodiment.

As illustrated in FIG. 1, an electronic control unit according to the present embodiment includes: an injector drive circuit 50 that drives an injector 60 which is a load; a pre-driver circuit 30 that controls the injector drive circuit 50; a power generation circuit 10 that generates a voltage applied to the pre-driver circuit 30 from a reference power supply V; an injector valve opening power supply unit 1 which is a step-up circuit that generates a step-up voltage VH from a reference power supply V; a step-down circuit 40 that steps down the step-up voltage generated by the step-up circuit to a drive voltage of the pre-driver 30; and a switch circuit 25.

The switch circuit 25 includes a power supply switch A20 provided between the power generation circuit 10 and the pre-driver 30, and a power supply switch B21 provided between the step-down circuit 40 and the pre-driver 30. Normally, the switch circuit 25 turns on the power supply switch A20 and turns off the power supply switch B21 to supply a voltage generated by the power generation circuit 10 to the pre-driver 30. Further, the switch circuit 25 turns off the power supply switch A20 and turns on the power supply switch B21 when the reference power supply V drops when power is cut off or the like, thereby supplying the voltage stepped down by the step-down circuit 40 to the pre-driver 30.

According to the present embodiment, when a voltage value supplied from the power generation circuit 10 becomes small due to the cut-off of power or the like, a residual charge of the injector valve opening power supply unit 1, which is the step-up circuit, is stepped down by the step-down circuit 40 and supplied to the pre-driver 30, so that the residual charge of the injector valve opening power supply unit is consumed as the drive voltage of the pre-driver 30.

The injector drive circuit 50 includes an injector valve opening driver 51 and an injector holding driver 52 on a high side of the injector 60, and an injector low-side driver 53 on a low side. The step-up voltage VH stepped up by the injector valve opening power supply unit 1 is applied to the injector valve opening driver 51, and the reference power supply V is applied to the injector valve opening driver 52.

Figure 2:
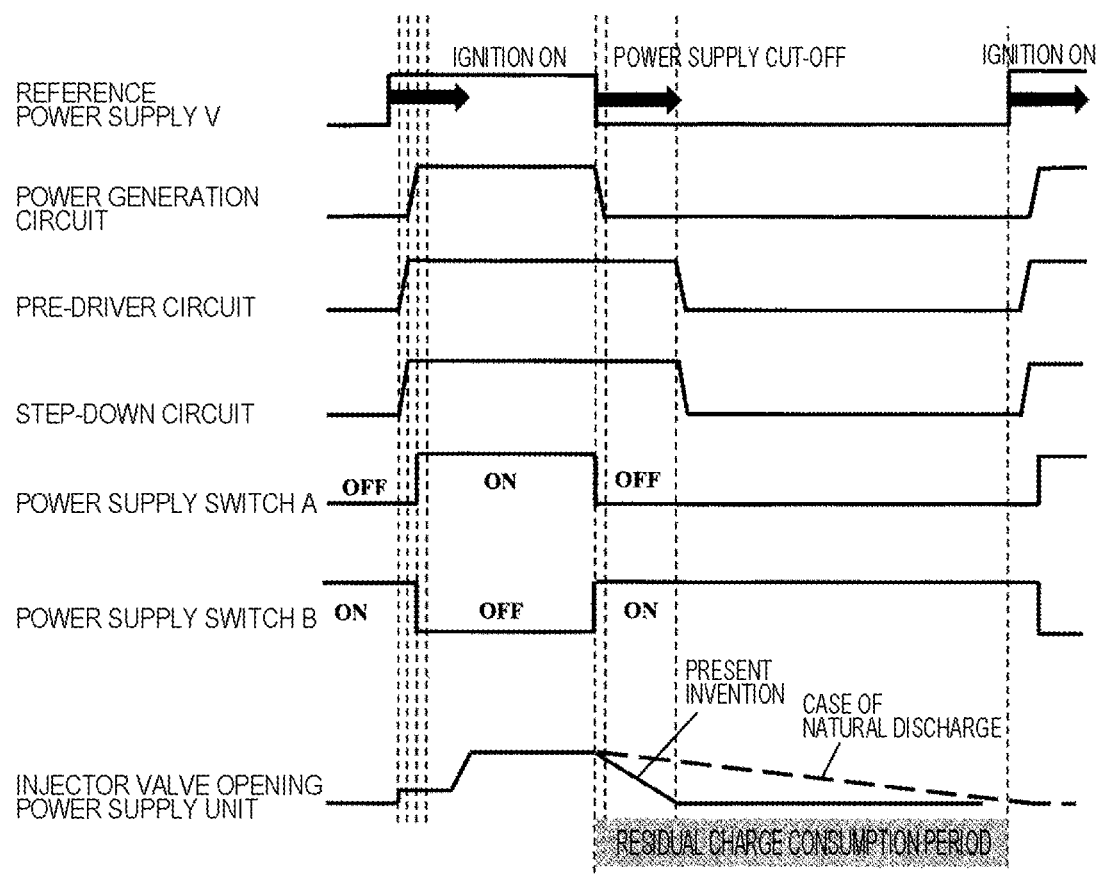
FIG. 2 is a timing chart according to the first embodiment.

FIG. 2 illustrates an operation sequence of each circuit.

When an ignition is turned on and the reference power supply V is input to the control unit, the reference power supply V is supplied to the pre-driver circuit 30 as an internal power supply of the pre-driver circuit 30, and the power generation circuit 10 is started after a lapse of a certain start-up time.

After that, the power supply switch A20 is energized to supply power to the pre-driver circuit 30. A timing at which the reference power supply V is input is linked to turn-on of an ignition key of a vehicle. A timing at which the reference power supply V is cut off is linked to a timing at which the power supply to the pre-driver circuit 30 is cut off.

The power supply switch A20 is a switch that operates so as to be energized (ON) when the reference power supply V is supplied and be de-energized (OFF) when the reference power supply V is cut off. The power generation circuit 10 generates a voltage to be supplied to the main power supply of the pre-driver circuit 30 from the reference power supply V, and supplies power to the pre-driver 30 via the power supply switch A20.

When the pre-driver circuit 30 is started to be turned into a controllable state, the step-up voltage VH for opening the injector 60 is generated by controlling the injector valve opening power supply unit 1. Incidentally, the step-up circuit in the injector valve opening power supply unit 1 illustrated in the present embodiment includes a step-up capacitor, and a charge of the capacitor after the reference power supply V is cut off is held for a certain period of time until being naturally discharged unless being forcibly discharged. The step-up voltage VH generated by the injector valve opening power supply unit 1 is supplied to the pre-driver circuit 30 and the step-down circuit 40 as the internal power supply of the pre-driver circuit 30 and a feedback power supply for generating the step-up voltage VH, respectively, in addition to the injector valve opening driver 51.

The step-down circuit 40 is configured to be capable of supplying power to the pre-driver circuit 30 when the power supply switch B21 is energized (ON) by stepping down the supplied step-up voltage VH to the drive voltage of the pre-driver circuit 30.

The power supply switch B21 is a switch that operates so as to be de-energized (OFF) to make the step-down circuit 40 stand by with low power consumption when the reference voltage V is supplied, and to be energized (ON) to supply the voltage stepped down by the step-down circuit 40 to the pre-driver 30 when the reference voltage V is cut off.

The pre-driver circuit 30 drives the injector 60 by controlling each of the injector valve opening driver 51, the injector valve-opening holding driver 52, and the injector low-side driver 53.

When the reference power supply V is cut off, the power supply switch A20 is de-energized, so that the power supply from the power generation circuit 10 to the pre-driver circuit 30 is cut off.

On the other hand, the power supply switch B21 is energized, and thus, the charge remaining in the capacitor of the step-up circuit is stepped down by the step-down circuit 40 and then flows to the pre-driver circuit 30 via the power supply switch B21, so that the residual charge is consumed. Since the power supply switch B21 is configured to be energized while the reference power supply V is cut off, the charge remaining in the capacitor can be consumed by the pre-driver circuit 30 until the next ignition key is turned on and the reference power supply V is input.

Figure 3:
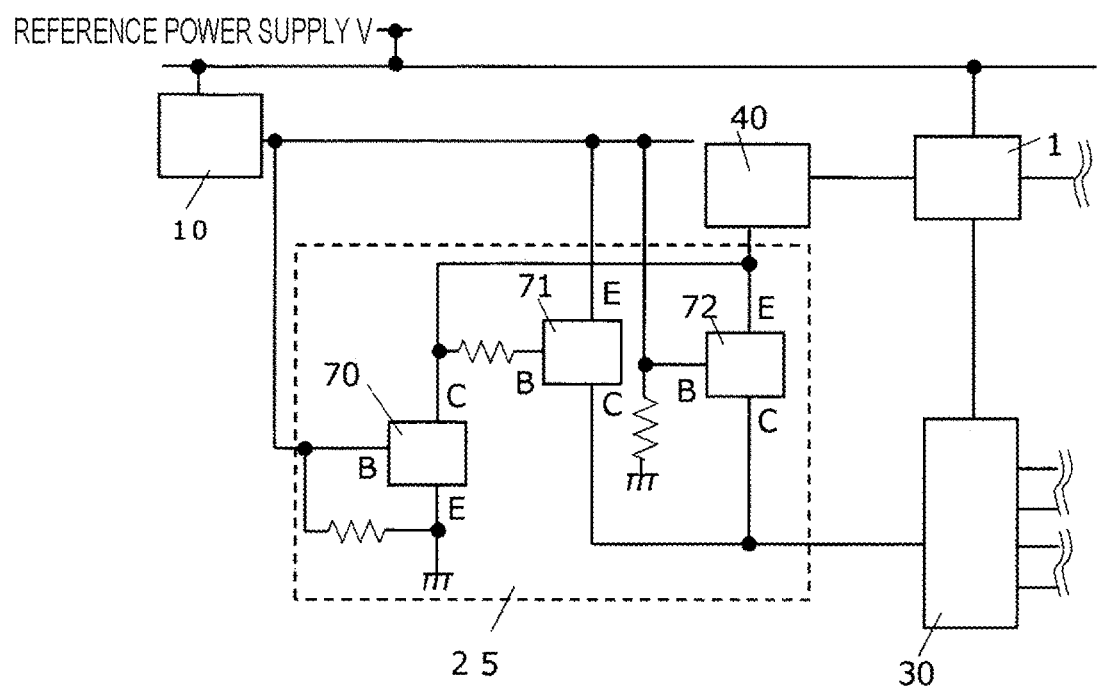
FIG. 3 is a circuit configuration of a power supply switch 25.
Figure 4:
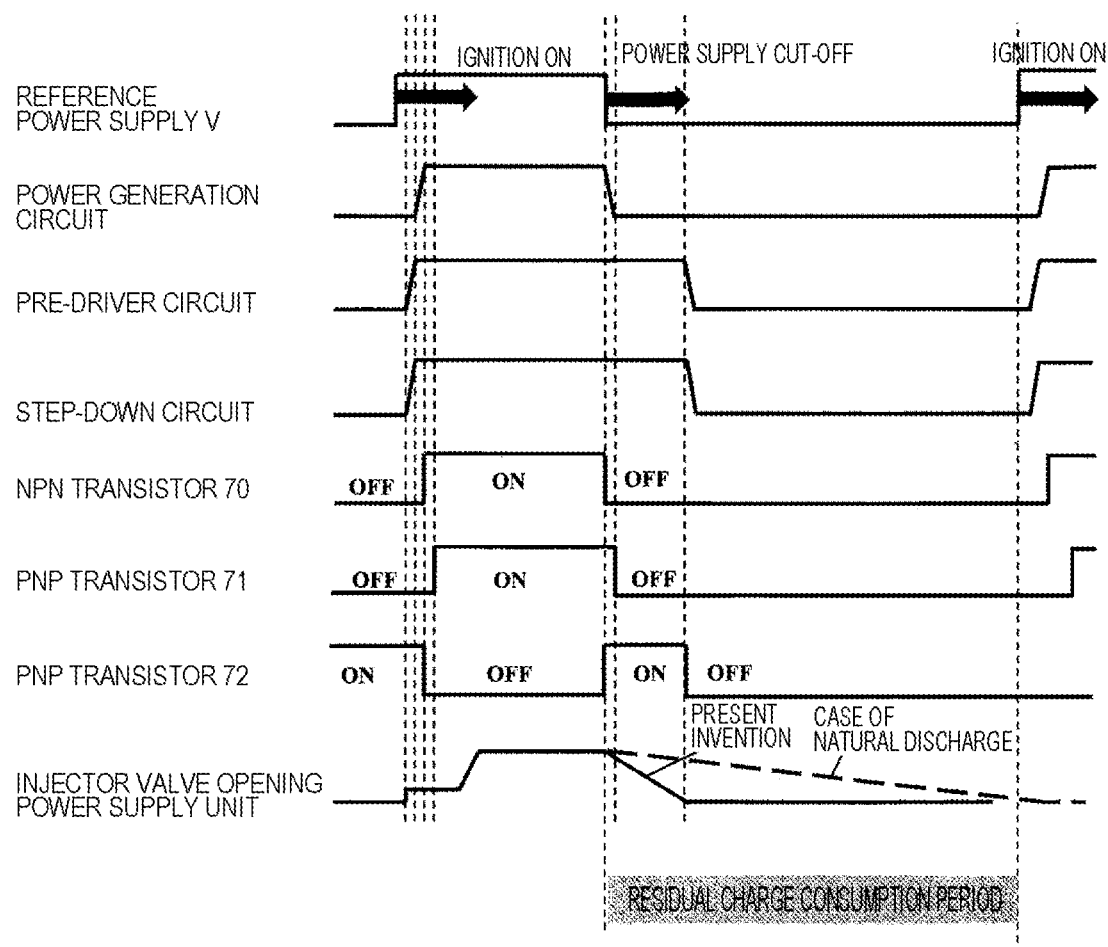
FIG. 4 is a timing chart of the power supply switch 25.
Figure 5:
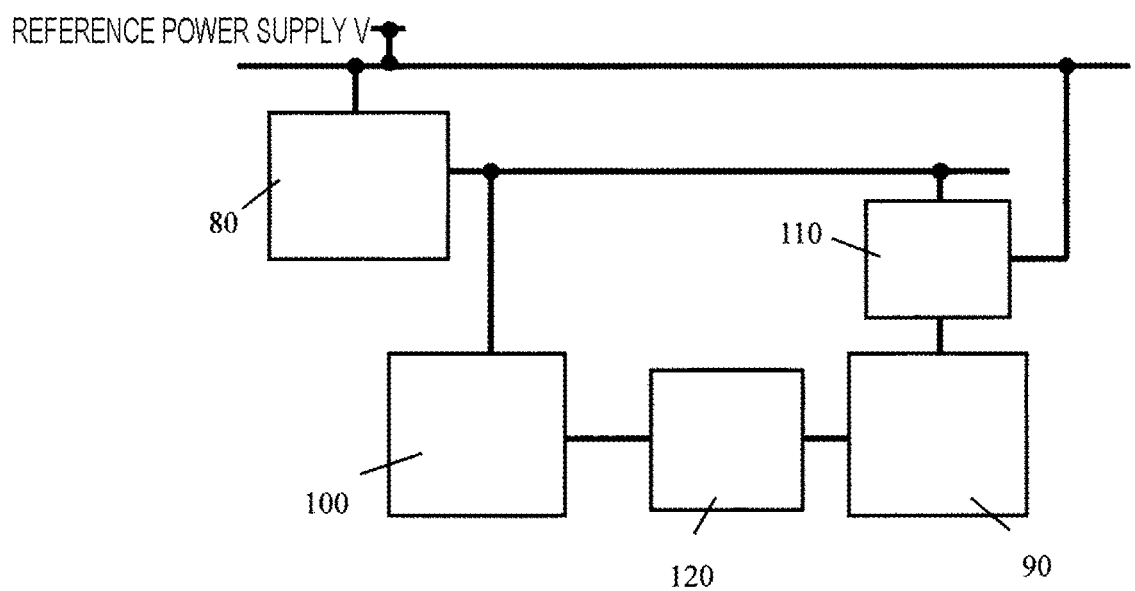
FIG. 5 is a circuit configuration according to a second embodiment.

An internal configuration example of the switch circuit 25 in the present embodiment is illustrated with reference to FIG. 3.

When the reference power supply V is input, a current is injected into a base of the NPN transistor 70, and an emitter and a collector of the NPN transistor 70 are energized. As a result, the base of the PNP transistor 71 has a GND potential, the current flows from the base to GND, and the emitter and the collector of the PNP transistor 71 are energized. On the other hand, a base of the PNP transistor 72 is connected to the power generation circuit 10, and thus, a potential difference between the base and an emitter of the PNP transistor 72 becomes the same while the reference power supply V is input, so that the PNP transistor 72 is de-energized.

When the reference power supply V is cut off, the base of the PNP transistor 72 has a GND potential, a potential difference is generated between the base and the emitter of the PNP transistor 72 while the charge remains in the capacitor of the step-up circuit, the current flows from the base to GND, and the emitter and a collector are energized. When the charge of the capacitor is completely consumed, the base and the emitter of the PNP transistor 72 have the same potential, and the emitter and the collector are de-energized. On the other hand, the current injection into the base is stopped when the reference power supply V is cut off in the NPN transistor 70, so that the NPN transistor 70 is de-energized. Since the base of the PNP transistor 71 is connected to the output of the step-down circuit 40, the base and the collector have the same potential, and the PNP transistor 71 is also de-energized.

The above configuration is an example of a configuration in which control for the energization and cut-off of the power supply switch A20 and the power supply switch B21 is realized by inputting and cutting off the reference power supply V.

The present embodiment is configured such that a connection destination of power supplied to the pre-driver circuit 30 using the switch circuit 25 is switched to the voltage generated by the power generation circuit 10 at the time of supplying the reference power supply, and to the voltage, obtained by stepping down the residual charge of the injector valve opening power supply unit 1 by the step-down circuit 40 when the power is cut off. Thus, the pre-driver circuit 30 consumes the residual charge when the power is cut off, thereby preventing the pre-driver circuit 30 from being exposed to the uncontrolled residual charge. Accordingly, it is possible to reduce stress due to the charge remaining in the circuit after the power is cut off, and thus, the durability of the electronic control unit is improved. Further, it is unnecessary to add a new backup capacitor since the capacitor used as the power supply is utilized as a backup power supply when power interrupted, which contributes to reduction in size.

Second Embodiment

The present invention may be applied to the following electronic control unit, which is different from an injector control unit including a step-up circuit such as the injector valve opening power supply unit 1.

A power supply IC 80 is connected to a reference power supply V, and power is generated by the reference power supply V. A circuit A90 and a circuit B100 are circuits that operate at the same potential as the power generated by the power supply IC 80, but power is directly supplied from the power supply IC 80 to the circuit B100, but the circuit A90 is a circuit to which power is supplied via the power generation circuit 110 due to insufficient power supply capability of the power supply IC 80. Further, a power generation circuit 110 is a circuit that uses a potential of a power supply voltage generated by the power supply IC 80 as a reference to generate power having the same potential as the potential from the reference power supply V. Incidentally, the circuit A90 includes a power storage element, and a charge in the circuit A90 is held for a certain period of time until being spontaneously discharged unless being forcibly discharged after the reference power supply V is cut off. Further, the circuit A90 and the circuit B100 are connected via the power supply switch 120, and the power can be supplied by making the power supply switch 120 energized.

The power supply switch 120 is de-energized while the reference power supply V is supplied, so that the circuit B100 is operated by the power supply IC 80. When the reference voltage V is cut off, the power supply switch 120 is energized to consume the charge stored in a capacitor in the circuit A90 in the circuit B100, so that the charge can be reduced to a voltage at which the circuit A90 is not driven.

Figure 6:
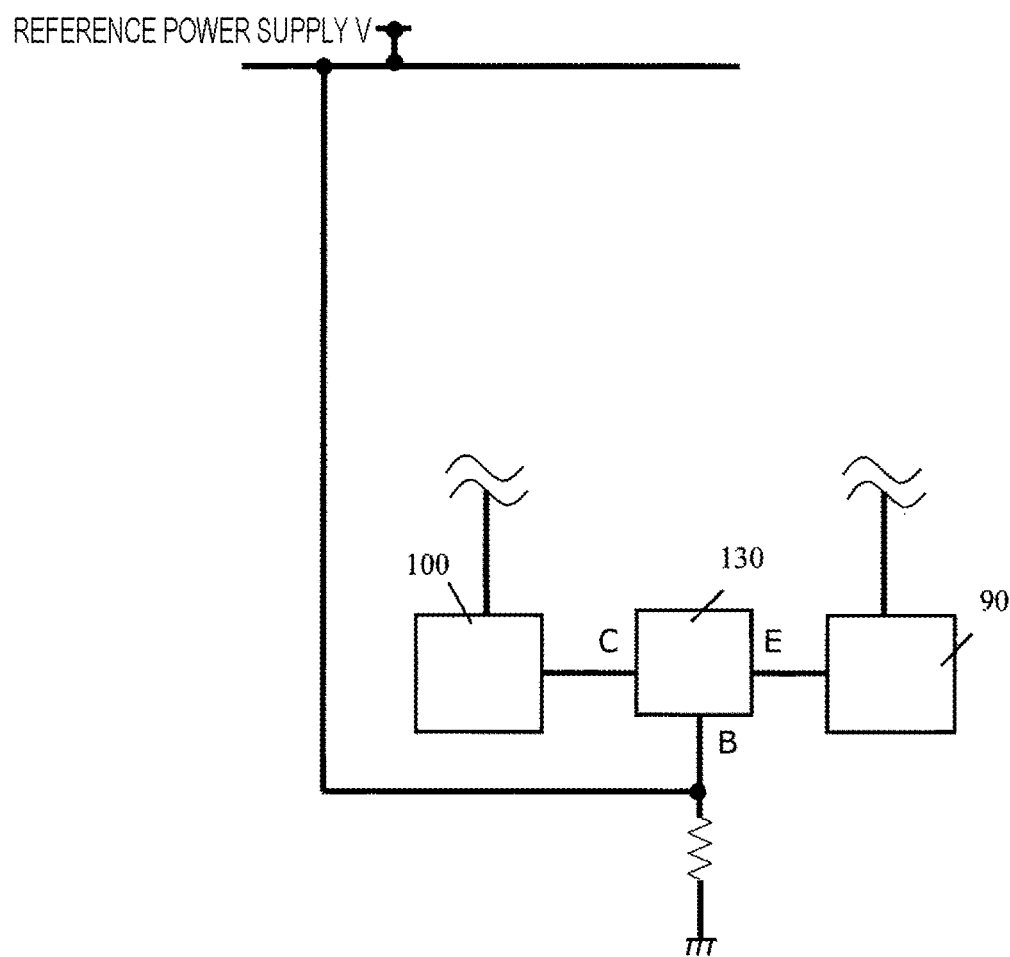
FIG. 6 is a circuit configuration of a power supply switch 120.

FIG. 6 illustrates an internal configuration example of the power supply switch 120. When the reference power supply V is input, a PNP transistor 130 connects a base to the reference power supply V, a potential difference between a base and an emitter of the PNP transistor 130 becomes the same potential while the reference power supply V is input, so that the PNP transistor 130 is de-energized. Further, when the reference power supply V is cut off, the base of the PNP transistor 130 has a GND potential, a potential difference is generated between the base and the emitter of the PNP transistor 130, a current flows from the base to GND, and the emitter and a collector are energized.

The present configuration is an example of the configuration in which the control for the energization and cut-off of the power supply switch 130 is realized by inputting and cutting off the reference power supply V in the electronic control unit that does not include the step-up circuit such as the injector valve opening power supply unit 1.

Although a circuit B100 can consume the charge in the present embodiment, an IC that can operate with the reference power supply V may be adopted. Further, it is also assumed that a plurality of connected circuits or ICs are connected.

In the present embodiment, the independent circuits A90 and B100 are connected by the power supply switch 120, and the power supply switch 120 is energized after cutting off reference power supply V, so that the charge remaining in the capacitor in the circuit A90 can be consumed in the circuit B100. Accordingly, it is possible to achieve the same effect as in the first embodiment even in the electronic control unit that does not include the step-up circuit.

REFERENCE SIGNS LIST

1 injector valve opening power supply unit
10 power generation circuit
20 power supply switch A
21 power supply switch B
25 switch circuit
30 pre-driver circuit
40 step-down circuit
50 injector drive circuit
51 injector valve opening driver
52 injector valve-opening holding driver
53 injector low-side driver
60 injector
70 NPN transistor
71 PNP transistor
72 PNP transistor
80 power supply IC
90 circuit A
100 circuit B
110 power generation circuit
120 power supply switch
130 PNP transistor

The invention claimed is:

1. An electronic control unit comprising:
a first circuit that drives a load;
a second circuit used as a power supply of the first circuit;
a third circuit that controls the first circuit;
a first switch that is interposed between the second circuit and the third circuit and is energized after cutting off supply of a reference power supply from an outside; and
a step-down circuit interposed between the second circuit and the first switch;
wherein the step-down circuit lowers a voltage stored in a capacitor of a step-up circuit of the second circuit to an operating voltage of the third circuit; and
wherein the first switch becomes de-energized to make the step-down circuit stand by when a reference voltage is supplied, and becomes energized to supply the voltage stepped down by the step-down circuit to the third circuit when the reference voltage is cut off.

2. The electronic control unit according to claim 1, further comprising:
a power generation circuit that generates a voltage to be input to the third circuit from the input reference power supply; and
a second switch element interposed between the power generation circuit and the third circuit.

3. The electronic control unit according to claim 2, wherein
the first switch element is de-energized and the second switch element is energized after the power generation circuit is started.

4. The electronic control unit according to claim 2, wherein
the first switch element is de-energized and the second switch element is energized after the reference power supply is supplied to the third circuit, and
the first switch element is energized and the second switch element is de-energized after the supply of the reference power supply to the third circuit is cut off.

5. The electronic control unit according to claim 2, wherein
the first switch is turned on and the second switch is turned off immediately after cutting off power supply to the second circuit, and
the first switch is turned off and the second switch is turned on after starting the power supply to the second circuit.

6. The electronic control unit according to claim 3, wherein
the load is an injector.

7. The electronic control unit according to claim 6, wherein
a voltage of the second circuit is lowered immediately after the power generation circuit is lost before an ignition is turned on next.

\* \* \* \* \*